(12) United States Patent
Reese et al.

(10) Patent No.: US 6,242,691 B1
(45) Date of Patent: Jun. 5, 2001

(54) ELECTRONIC PACKAGING AND METHOD OF PACKAGING

(75) Inventors: Kenneth C. Reese, Orlando; Michael Janssen, Oviedo; John M. Balsley, Orlando; Mark A. Wilson, Rockledge; Lauren J. McSorley, Orlando, all of FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/243,767

(22) Filed: Feb. 3, 1999

(51) Int. Cl.$^7$ .................................................. H05K 9/00
(52) U.S. Cl. ..................... 174/35 R; 174/52.1; 361/678; 361/690; 361/816; 361/818
(58) Field of Search ............................ 174/35 MS, 35 R, 174/52.1, 145, 167; 361/678, 690, 695, 816, 818

(56) References Cited

U.S. PATENT DOCUMENTS

| | | | |
|---|---|---|---|
| 5,142,442 | * 8/1992 | Daniels et al. ........................ | 361/384 |
| 5,160,357 | * 11/1992 | Faber ................................... | 55/385.2 |
| 5,493,473 | * 2/1996 | Yanagi .................................. | 361/695 |
| 5,680,295 | * 10/1997 | Le et al. ............................... | 361/695 |
| 5,717,576 | * 2/1998 | Van Doeselaar et al. ........... | 361/816 |
| 5,721,670 | * 2/1998 | Cochrane et al. .................... | 361/695 |
| 5,756,934 | * 5/1998 | Purdom .............................. | 174/52.1 |
| 5,808,866 | * 9/1998 | Porter .................................. | 361/695 |
| 5,812,373 | * 9/1998 | Hwang ................................. | 361/704 |
| 6,028,775 | * 2/2000 | Batten, Jr. et al. .................. | 361/816 |

* cited by examiner

Primary Examiner—Dean A. Reichard
Assistant Examiner—W. David Walkenhorst
(74) Attorney, Agent, or Firm—Eric R. Katz

(57) ABSTRACT

Protective packaging for electronic equipment includes an expanded foam body with cavities for components, air ducts, and the like. An outer EMI bag surrounds the equipment containing foam body. The assembly is enclosed within a deformable exterior case which includes front and rear covers, air filters, or fans. The cases are modular and stackable. Integrally formed connectors electrically couple adjacent cases together. The connectors couple the EMI bags together to form a common shield.

25 Claims, 7 Drawing Sheets

ELECTRONIC PACKAGING AND METHOD OF PACKAGING

FIELD OF THE INVENTION

The invention pertains to packaging for electronic devices which enables the devices to operate, and be operated, in severe environmental service conditions. More particularly, the invention pertains to such packaging which not only enhances operability in severe environmental service conditions but is stackable and modular so as to promote relatively easy field configuration, upgrading or reconfiguration based on user requirements.

BACKGROUND OF THE INVENTION

The ability of electronic equipment to survive and to be usable in severe environmental conditions is an attribute which has been recognized for many applications. Such severe environmental conditions include rain, desert heat, dust or noisy electromagnetic conditions. Other types of severe environmental conditions include mechanical vibrations generated by moving vehicles or intentionally induced, extreme electromagnetic interference.

Known housings or cases usually are intended to be rigid and mechanically resistant to deformation. The rigidity of the case is used to protect an internal instrument.

Beyond a need to protect the equipment from the environmental conditions, there is a need to be able to provide electrical signals to and to obtain or read electrical signals from the equipment. The subject electrical signals may well be provided by other adjacent equipment or transmitted to such adjacent equipment. Hence, it has also been recognized that merely protecting the equipment is often sufficient only for shipping purposes.

To use the equipment while at the same time continuing to protect it from the severe environmental conditions requires that it be possible to couple connectors to the equipment, though enclosed in protective packaging, reconfigure, replace, update or provide maintenance to the equipment. Further, one piece of electrical equipment is often advantageously located adjacent to another, different, piece of electrical equipment. Hence, it would be desirable to be able to stack or interchange packaged equipment.

Known protective systems require external cables to interconnect instruments. Such cables can, unfortunately, be lost or misplaced at times.

Thus, there continues to be a need for packaging which enables electronic equipment to survive in severe environmental conditions. Preferably such packaging will be user-friendly from the point of view of configuring packaged equipment for operation and subsequently using the equipment not withstanding the severe environmental conditions. Finally, it would be preferable if the packaging exhibited a standardized, modular, stackable aspect ratio to facilitate transportability.

SUMMARY OF THE INVENTION

In accordance with the invention, lightweight packaging for electronic equipment enables that equipment to be used in severe environmental conditions. The packaging is multi-layered and modular.

An expanded foam body or block has cavities for various component mountings and air ducts. The expanded foam body includes an outer EMI screen or bag.

The entire assembly is enclosed within a deformable plastic case. The flexible outside case provides environmental protection from dust, water, and other contaminates; and deforms when dropped to absorb shock.

The case includes front and rear covers as well as air filters, EMI filters, fans, etc. In one aspect, conductive frame-like members surround various openings of the EMI bag. In another aspect, flexible EMI joints/gaskets are located between an inner EMI coating on the case and the internal equipment. The internal equipment is thereby permitted some degree of movement without causing damage to the EMI shielding.

In a packaging method, an electrical unit is mounted in a foam carrier. The foam carrier is wrapped with an EMI conductive bag. The assembly is then enclosed in a weather proof plastic case. Alternately, the EMI conductive bag or shield can be attached to the interior of the plastic case.

In yet another aspect, where a deformable or flexible outer case is used, shock and vibration protection can be provided using an internal structural cage. The structural cage may be made from metal or composite materials. It serves a dual function, by surrounding and protecting the electrical components and also providing strength to the outside flexible case.

The structural cage can be squeezed into the outside case, preloading the foam and giving both shape and structure to the outside case. The structural cage in one aspect, can be separated from the outside case by foam. The cage, combined with the preloaded foam, provides the rigidity to stack cases one on top of another.

Traditional electronic/electrical assemblies, such as standard 19 inch rack mounted equipment, or card cages can be mounted to the internal structural cage located in the foam body components then plug into the card cage for easy removal or replacement. The housing assembly is universal, allowing "19 inch rack equipment" or many varieties of components to be plugged into the card cage using conventional means. Easy access is provided for repair and replacement.

A system can be composed of several cases, each containing a variety of pieces of equipment. An integral, spring loaded, floating electrical connector in each case provides connections between cases.

The connector uses removable pins. The cable for each component is made with pins to fit the connector. To replace a component, the component cable is also replaced by snapping the pins in or out of the floating connector.

The advantage of the inventive packaging becomes apparent since it is easy to replace or reconfigure an entire system without mechanical redesign. The floating connector is spring loaded to retract itself into the case side wall where it is protected from damage. Mating of the connector is accomplished with a spring loaded cross bar to engage the connection between cases, the operator would push in on the cross bar, extending the connector out the opposite side and into the adjacent case.

The shock and vibration isolation foam is non-conductive. Hence, there is no concern for shorting electrical components against the foam. The foam material can be optimized for shock and vibration properties since it does not serve the dual function of EMI protection. Since the foam is optimized for shock and vibration, the quantity of foam can be minimized, further reducing weight.

A conductive bag is placed around the outside of the foam to provide EMI protection. The bag is located between the outside case and the foam and is protected from the weather. To ensure continued EMI performance over time, the bag joints can be sandwiched between conductive metal frames. This method of attachment provides a gas tight seal and prevents performance deterioration over time.

Thus, a ruggedized modular packaging system for instruments not only provides EMI shielding on a modular basis, but that shielding extends between coupled modules. Built-in spring loaded connectors make inter-module connections quicker and without extra cables which can get lost.

Numerous other advantages and features of the present invention will become readily apparent from the following detailed description of the invention and the embodiments thereof, from the claims and from the accompanying drawings.

DETAILED DESCRIPTION OF THE PREFERRED EMBODIMENTS

Figure 1:
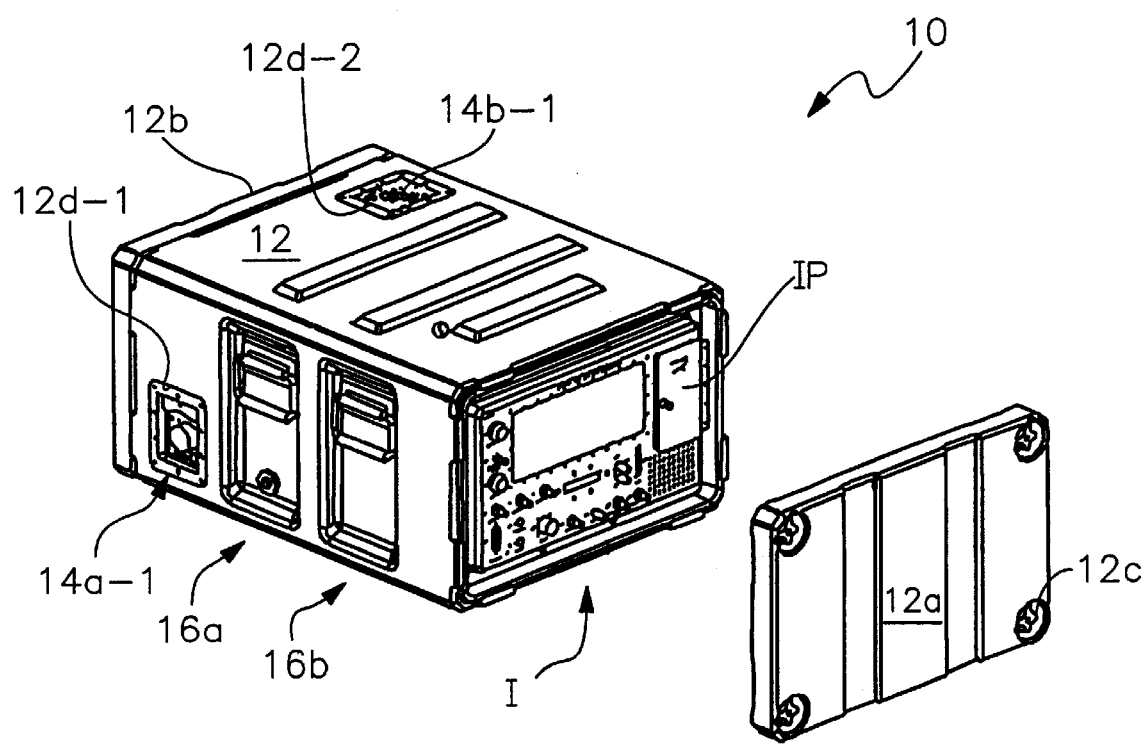
FIG. 1 is a perspective view of an instrument module in accordance with the present invention with the front cover removed.

While this invention is susceptible of embodiment in many different forms, there are shown in the drawing and will be described herein in detail specific embodiments thereof with the understanding that the present disclosure is to be considered as an exemplification of the principles of the invention and is not intended to limit the invention to the specific embodiments illustrated.

FIG. 1 illustrates an over-all view of a packaging module 10 in accordance herewith. The module 10 includes a deformable, molded, exterior shell or case 12 which has a front cover 12a and a rear cover 12b. The covers 12a, 12b are openable as discussed subsequently. As illustrated in FIG. 1, cover 12a is removably attachable to system 10 by fasteners 12c which could, for example, be twistlock-type connectors.

Shell or case 12 includes a plurality of interface connector ports, 12d-1 and 12d-2. The interface ports each include a respective connector, for example connector element 14a-1 and connector element 14b-1. Connector elements 14a-1, 14b-1 make it possible to rapidly interconnect additional similar modules to the module 10 without any need for exterior cables. The exterior shell also carries a plurality of spaced apart carrying handles illustrated in FIG. 1 as handles 16a, 16b.

Carried within shell 12 is an electronic instrument illustrated generally at I. With the front cover 12a removed, instrument I can then be operated. Module 10 provides a modular, shielded ruggedized packaging environment in which instruments such as instrument I can be transported and then rapidly interconnected using connectors 14a-1, 14b-1.

Shell or case 12 is formed of molded plastic and is intended to be deformable. If module 10 should be dropped, case 12 will deform due to impact, as opposed to breaking, and then spring back to its normal shape. Because of the flexibility of case 12, a smaller case or module can be provided while at the same time providing the same degree of protection to the instrument I that a larger rigid case would provide.

Figure 2:
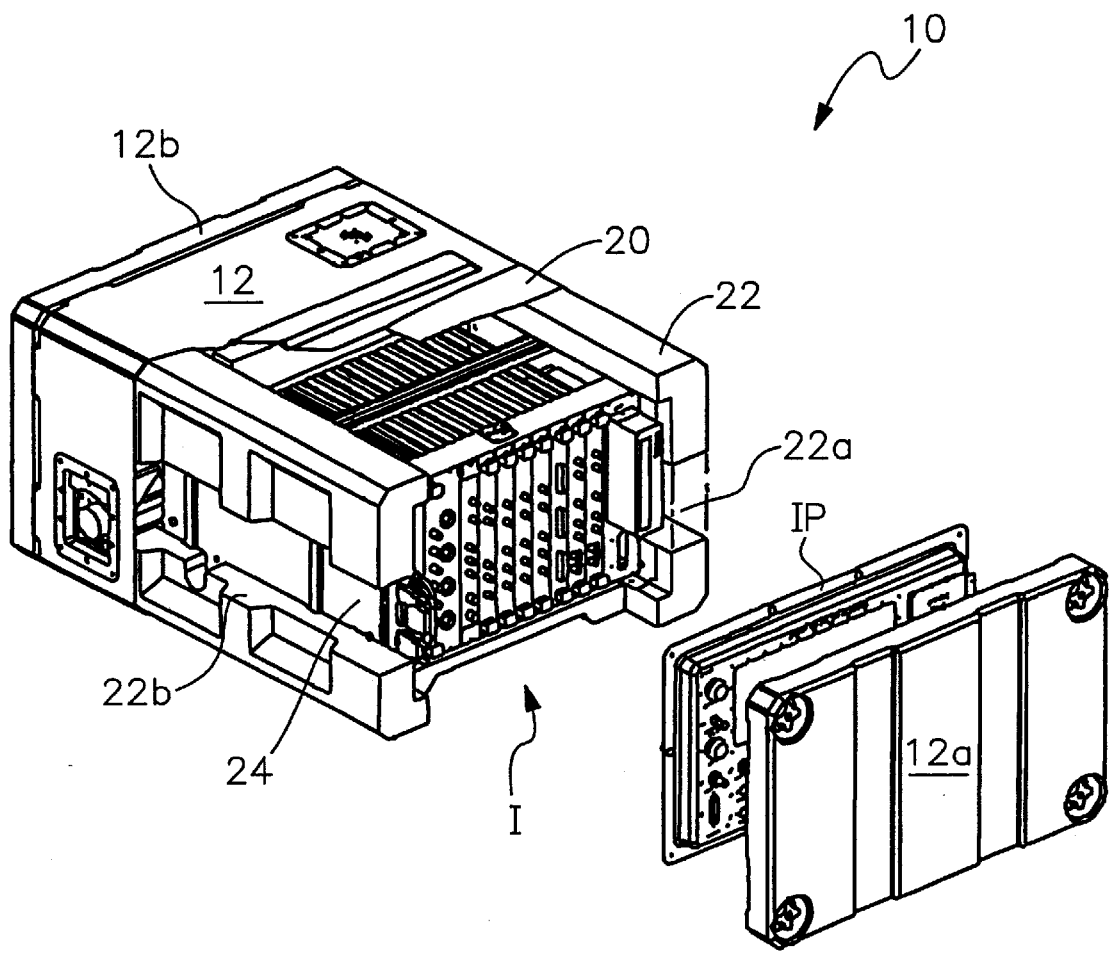
FIG. 2 is a view of the module of FIG. 1 with a portion of the exterior case broken away to illustrate the internal structure thereof.

FIG. 2 illustrates module 10 with a portion of case 12 broken away to illustrate further structural details. Contained within case 12 is an EMI shield, which could be implemented as a conductive bag, 20. Shield 20 could be glued to an interior surface of casing or shell 12 and provide and interior shielded region for instrument I. Shield 20 can be formed from a conductive, flexible, metallic or plastic bag. Alternately, an appropriate EMI coating can be deposited on an interior surface of shell 12.

The EMI shield 20 is sandwiched between shell 12 and an interior molded foam shell 22. The foam shell 22 has an exterior shape and structure compatible with shell 12 and an interior molded shape compatible with the shape of instrument I. To further support the instrument I, a structural metal frame 24 or card cage can be carried within the inner foam case 22 adjacent to instrument I. For example, frame 24 can correspond to a standard size VXI card cage. A power supply can also be included and supported by the frame and the foam.

Foam case 22 can be molded so as to include cable trays 22a and air flow channels, such as channel 22b, to facilitate the flow of cooling air. The flow channels can be arranged so that cooling air can be drawn in adjacent a rear cover 12b drawn across the various elements of the instrument I and then expelled once again out the back cover or, alternately, out the front cover.

Instrument I would normally be configured with a front panel IP which would provide the displays, knobs and switches and the like which would be needed to operate the instrument I. The front panel IP can also be electrically connected to EMI shield 20 while the instrument is being operated so as to contribute to a completely EMI-shielded enclosure.

For a given weight and configuration of instrument I, module 10 provides a compatible internal volume and shape. For a different electrical unit, a different internal volume and shape would be provided. The respective exterior case however would have a size and shape compatible with module 10.

Figure 3:
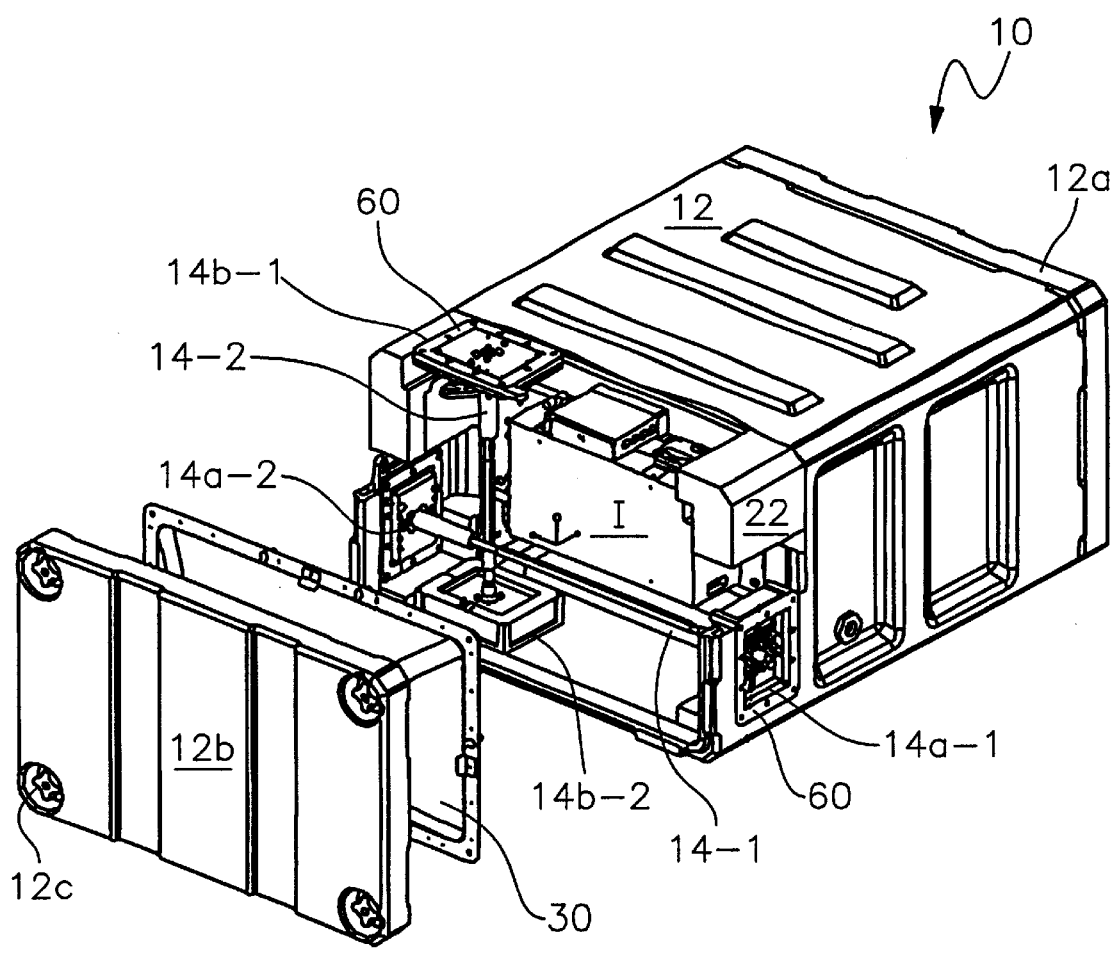
FIG. 3 is a rear view of the module of FIG. 1 with the rear cover removed.

FIG. 3 illustrates details of the rear of the module 10. Instrument I is illustrated being supported within inner foam shell 22. A fan assembly 30 is located adjacent to rear cover 12b, illustrated with similar twistlock connector elements 12c. Fan assembly 30 in addition to supporting one or more fans to move cooling air through the module 10 can also contribute to EMI shielding of this end of module 10.

The module 10 includes two spaced-apart connector elements 14a-1, -2 illustrated mounted on sides of case 12 in a generally vertically orientation. Module 10 also includes two horizontally oriented connectors 14b-1, 14b-2.

One of each pair of connectors is a male, for example connector 14a-1 could be configured as a male connector, and 14a-2 as a female connector. This configuration makes it convenient to interconnect modules which are located next to one another in a horizontal plane. Similarly, connector 14b-1 could be configured as a female connector and 14b-2 as a male connector. With this configuration, stacked modules can be readily interconnected with one another.

Figure 7:
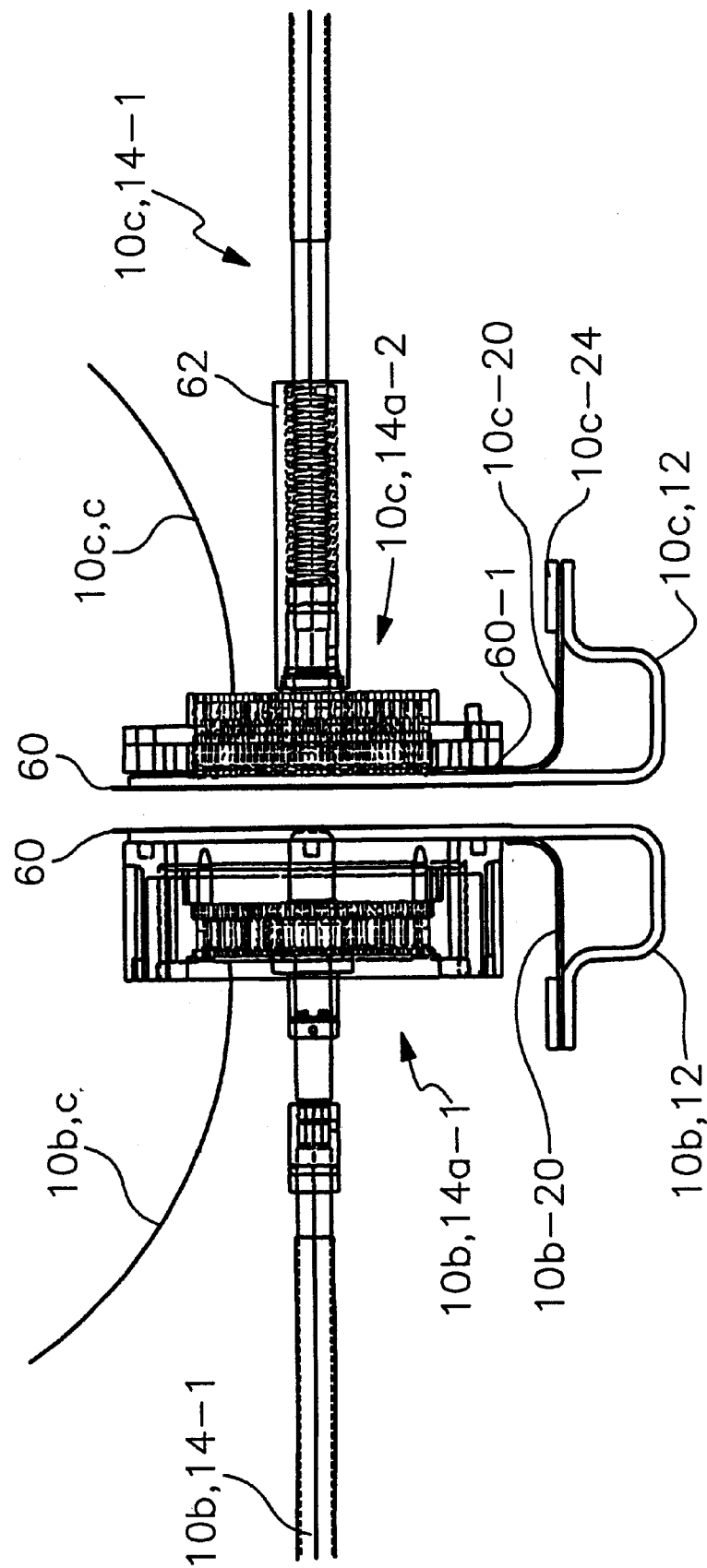
FIG. 7 is an enlarged partial view illustrating the interconnectivity of modules of the type illustrated in FIG. 1.

Each of the respective male connectors is configured so as to be spring biased to retract the connector pins into the respective housing to protect them, best seen in FIG. 7. As discussed in more detail subsequently, the respective connector pins can be forced outwardly from the respective case 12, via shafts 14-1 and 14-2, to enable them to make contact with a compatible female connector mounted on an adjacent module.

Each connector is configured with removably insertable connector pins. This facilitates programming the respective connector based on the instrument in the module and desired inputs and outputs to be supplied to the local instrument or to be transmitted through the module to an adjacent module.

Figure 4:
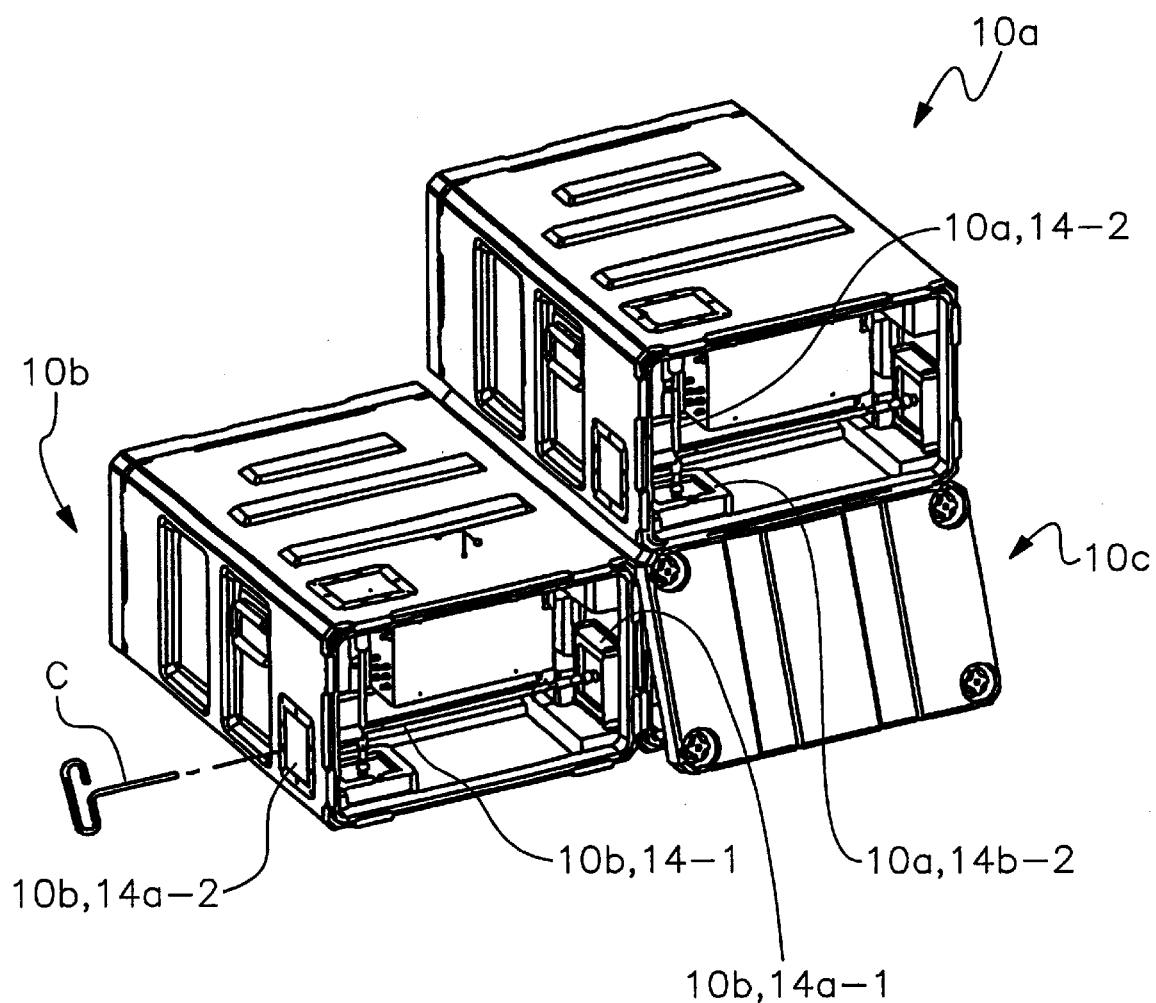
FIG. 4 illustrates a modularly expandable electronic system using multiple modules of the type illustrated in FIG. 1.

FIG. 4 illustrates an interconnected plurality of modules 10a, 10b and 10c. Module 10a is stacked on module 10c. They are interconnected by male connector 10a,14b-2 and correspondingly located female connector 10c,14b-1. Similarly, with respect to module 10b, male connector 10b,14a-1 has been forced into its extended position so as to slideably engage pins of female connector 10c,14a-2.

The male connectors can be extended for interconnection purposes using connector wrench C which extends through an opening in the respective female connector, such as female connector 10b,14a-2 and engages a respective connector shaft, such as connector shaft 10b,14-1 or 10a,14-2 for purposes of extending the pins of the respective male connectors such as 10b,14a-1 or 10a, 14b-2.

The respective male connector can be locked into the extended position, for example by rotating wrench C. The extended male connector pins slideably engage receiving pins in the respective female connector such as the connector 14a-2 in module 10c.

It is an advantage of the present structure that to disconnect module 10b from modules 10a, 10c for replacement purposes, it is only necessary to use connector wrench C to release male connector 10b,14a-1 permitting the pins of same to retract into module 10b. A replacement for module 10b can be provided and wrench C can again be used to couple the respective male connector to the female connector of module 1Oc thereby reconfiguring the system of FIG. 4 for operation again.

As the previous example demonstrates, no exterior cables need be connected or disconnected to facilitate the interconnectability or disconnectability of the respective modules. Since the connectors are accessible along the side and top surfaces of the modules, operators or maintenance personnel need not go around to the back of the equipment to connect or disconnect the respective module.

Figure 5:
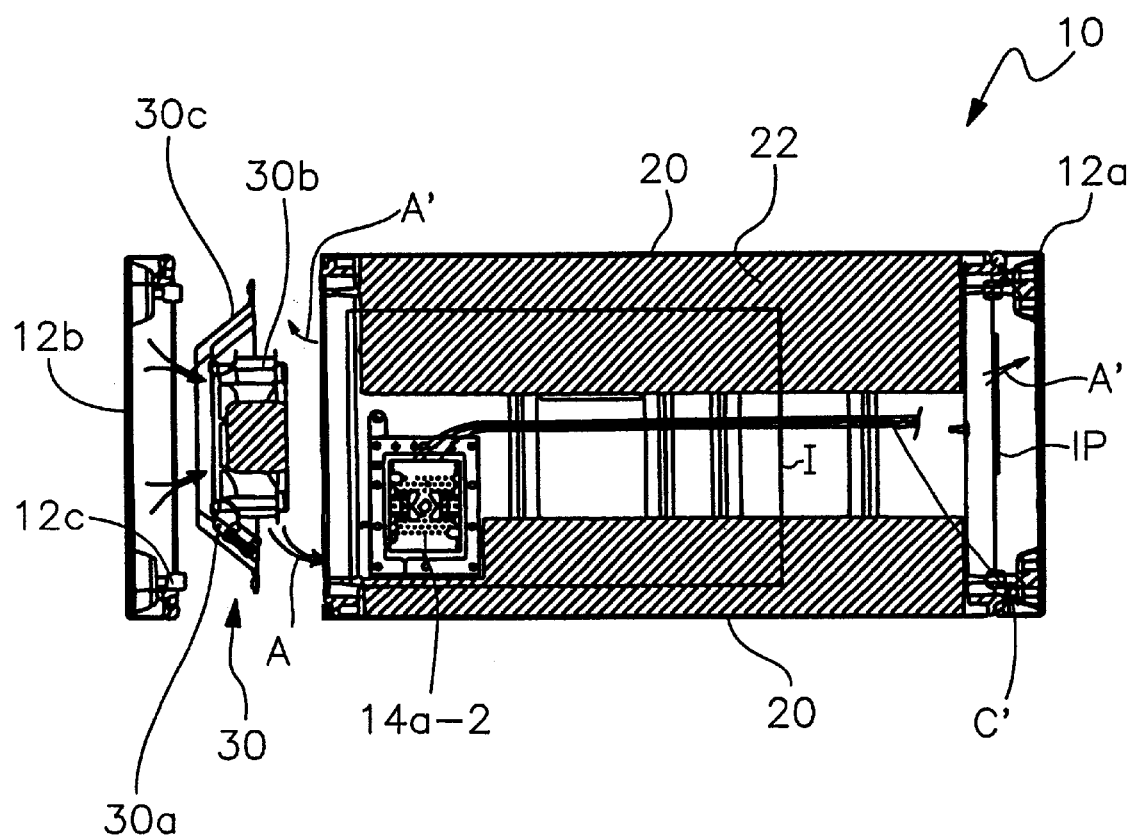
FIG. 5 is a sectional view illustrating additional details of the module of FIG. 1.

FIG. 5, a view in section, illustrates additional details of module 10.

As illustrated in FIG. 5, fan assembly 30 includes a fan mounting plate 30a which carries one or more ventilating and cooling fans 30b. Additionally, the assembly 30 includes an EMI rear cover element 30c implemented, for example, as a perforated metal plate.

Rear cover 12b, if desired, can be perforated enabling the fan 30b to draw air through the cover for purposes of cooling the instrument I carried by the foam element 32. Alternately, cover 30b can be hinged, along a top edge as in FIG. 4 for ventilation. In this instance, the hinge would exclude moisture or rain.

As illustrated in FIG. 5, cooling air A can be injected under pressure, by fan 30b, into channels molded into the foam 22 to provide flow conduits for the cooling air over and through the instrument I. Other flow conduits can be provided, illustrated in FIG. 5, to permit the outflow of cooling air A' through the instrument panel IP and out the front cover 12a. Additionally, as illustrated in FIG. 5, an exemplary instrument cable C' is coupled between connector 14a-2 and another portion of instrument I and is intended to be run through cable tray 22a.

Figure 6:
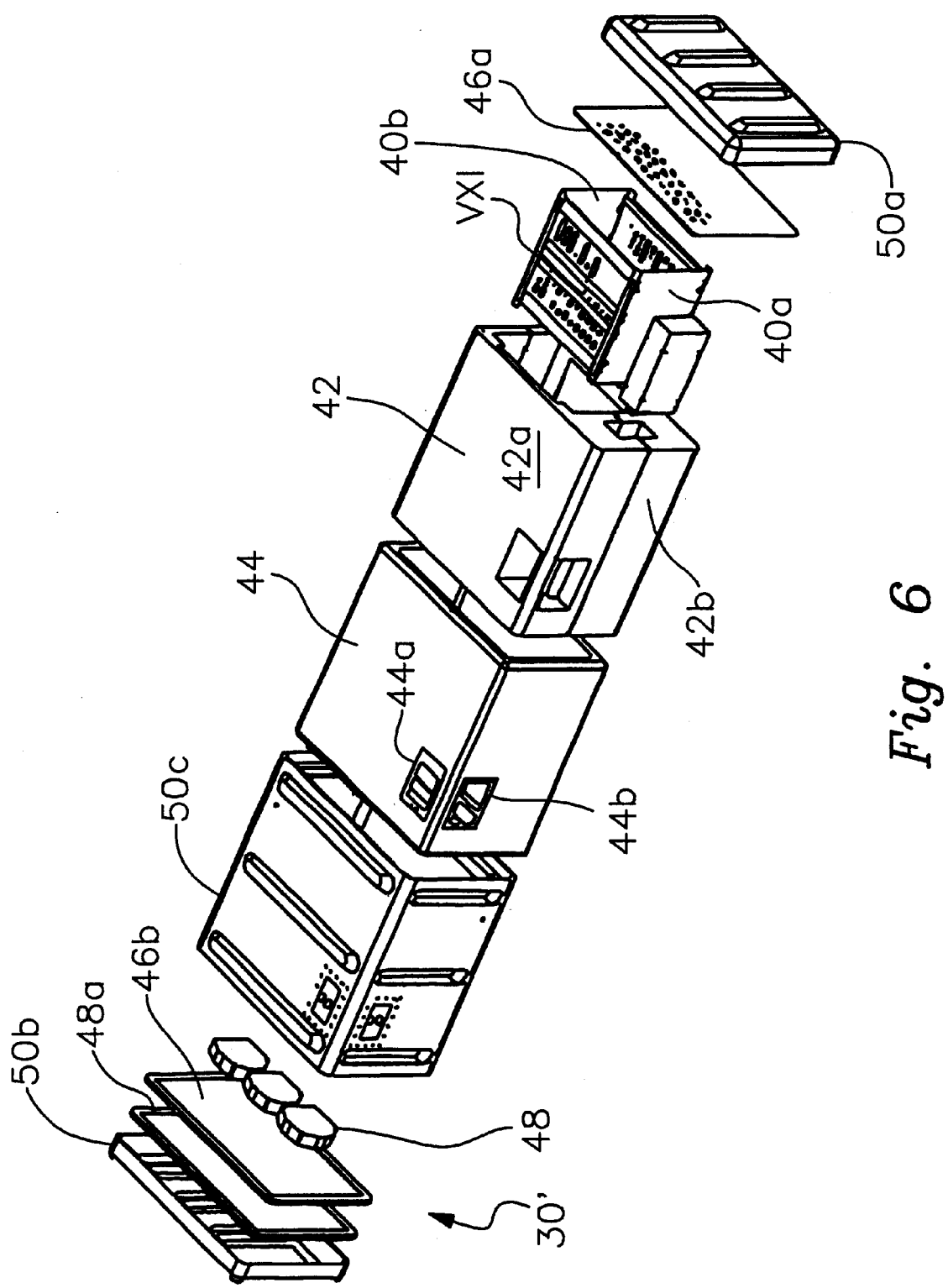
FIG. 6 is an exploded view of an alternate form of the module of FIG. 1.

FIG. 6 illustrates in exploded form a multi-layer module 10' for a VXI card cage. The module 10' includes structural frame members 40a and b which mechanically support the cage. The cage is carried within premolded foam support shell 42 which, as illustrated in FIG. 6, has an upper portion 42a and a separate lower portion 42b which can be taken apart for purposes of installing the cage therein.

EMI bag or shield 44 surrounds foam support element 42. The various connectors are also coupled to conductive EMI suppressing members 44a, 44b which also serve to couple the EMI shield 44 between adjacent modules to form a continuously extending shield in horizontal and vertical directions.

Front panel 46a, which could be metallic, is also electrically coupled to shield 44 as is metallic, perforated EMI filter 46b. A plurality of fans 48 can be provided adjacent to the EMI filter 46b for purposes of cooling the instrument contained in the foam support 42. Associated with fans 48 is an air filter 48a which is located adjacent the EMI filter 46b.

The module 10' is closed with a front cover 50a which can be hinged or pivoted to function as a work surface. The module 10' is closed at a second end by rear cover 50b. The cover 50b can be perforated in order that the fans 48 can draw in ambient air for cooling purposes and also expel warm air from the instrument. For operational convenience, cover 50b can be hinged at the top which also provides a water resistant seal when the module 10' is in use.

It is a particular advantage of the present packaging system that the filter 48a in combination with relatively air flow provided by fans 48 will cause condensation of moisture onto the filter 48a. The condensed moisture on the filter 48a, which could be formed of a polyester, merely runs or drips off the bottom of the filter thereby precluding same from being drawn into the interior of the support foam 42. It will be understood that the filter 48a could be implemented of a variety of non-absorbent materials that promote the run-off of the condensed moisture.

For purposes of promoting modularity if desired, the front cover 50a and the rear cover 50b could be identical. If rear cover 50b is perforated, the instrument in module 10' could be operated with the front and rear covers attached and closed.

FIG. 7 illustrates further details of the inner-relationship of connector 10b,14a-1 and connector 10c,14a-2 of module 10c, see FIG. 4. Male, spring loaded, floating connector 10b,14a-1 is illustrated being brought into electrical contact with fixed female connector 10c,14a-2.

Engagement member 10b,14-1 forces connector 10b, 14a-1 toward female connector 10c, 14a-2 in an engaging direction. Wrench C can be used to lock the two connectors together. The details of the locking mechanism are not a limitation of the present invention and would be known to those of skill in the art.

Each of the connector cross-bars such as 10b,14-1 and 10c,14-1, includes a biasing spring 62. Spring 62 is configured to retract the pairs of the respective male connector, such as connector 10b,14a-1, into the respective case 10b, 12 or 10c,12 to protect them when the modules are being moved.

Cables 10b,c and 10c,c can slideably engage the respective connectors 14a-1 and 14a-2 to provide electrical connectivity to and from the respective instruments in the modules 10b, 10c. Additionally, electrical conductors can be coupled between respective pins of connector 14a-1 in module 10b as well as 14a-2 also in module 10b to provide electrical connectivity between module 10c and another module, not illustrated, adjacent to module 10b. Similarly, one or more of conductors of cable 10c,c can engage connector 10c, 14b-1 which is in turn an electrical contact with connector 10a, 14b-2 of module 10a thereby providing for electrical connectivity between module 10b and module 10a.

It should be noted that the above described connectivity is readily alterable. Programming is achieved based on the pins which are inserted into the connector blocks of the respective connectors as well as the electrical connections which are made to the respective pins.

The structure of the various connector elements also contributes to the EMI shielding. Associated with each of the connector elements is an exterior metal mount 60, see FIG. 7. The exterior mounts 60, which are conductive, are electrically coupled to interior EMI shields such as 10b-20 and 10c-20.

When the modules are located adjacent to one another and interconnected using the respective integral connectors, the adjacent metal conductive plates 60 contact one another and create a continuously extending EMI shield between modules in both horizontal and vertical directions. The internal EMI shields such as 10b-20, 10c-20 can be sandwiched between an interior mounting plate, 60-1, see FIG. 7, at each connector and a respective exterior mounting metal plate 60 to insure a high quality EMI shield. With this configuration, the respective connector block and associated connective pins are still contained within a common EMI shield which can be expanded on a modular basis.

The present modular system, in a preferred embodiment, is configured with a plurality of individual transient cases (enclosures with interfacing connectors, designed to make system set-up fast and easy). A typical enclosure contains a "C" size VXI card cage, power supply, and instruments. Individual instruments plug in and out of the card cage for easy replacement and repair.

EMI radiation protection is provided by an electrically conductive bag, which lines the inside of each case. The front and rear of each case is closed off with aluminum panels to provide EMI isolation. For access to instruments, the front panel can be quickly removed using ¼ turn fasteners.

The modules provide a cableless assembly process to enhance modularity and provide easy set-up. Integral interface connectors provide both the mechanical and electrical connections between cases. For durability, a stainless steel pad surrounds each of these connectors. The pad provides protection as well as a grounded, EMI mating surface between each module. The interface connector is designed with a 0.2 inch float to accommodate mechanical tolerances, and is designed to withstand rough field service handling.

The connector configuration provides relatively immediate test equipment reconfigurability. Every instrument has an internal mating cable for communication and power connection to adjacent modules. These cables are unique to the instrument. Therefore, when an instrument is changed, its cable must also be replaced. The interface connector of each module is designed to facilitate this cable replacement.

Each instrument cable is terminated with snap-in-pins. The operator can extract the cable pins from the interface connector and easily replace a cable. To replace an instrument, the instrument is unplugged from the card cage. The old cable is removed. The new instrument can be installed. The new cable can be inserted into the case. The cable's pins can be snapped into the interface connector. Growth of the system can be accomplished by adding instruments to an existing card cage or by attaching an additional module.

Cooling is provided by a centrifugal blower/fan mounted inside the rear cover of the module. The blower pulls air into the rear of the case through a dust filter and EMI screen.

Blowers preferably are sized to provide sufficient forced convection cooling to meet the system operational requirements from sea level to 10,000'. A dirt and dust filter covers the rear of the case, providing, for example, over 220 square inches of filter area. The dust filter is disposable or it can be cleaned with soap and water, then replaced.

The large air filter was incorporated to keep airflow pressure drop low and extend the time period required for filter maintenance. Routine maintenance consists of replacing or cleaning of the air filters.

The filters are held in place using spring clips. Under the air filter is a perforated aluminum sheet that provides EMI protection. Blowers driven with brushless motors force air through the enclosure. Air exhaust from the front of the transient case, but the air velocity is low and is not directed, nor does it cause any discomfort to operating personnel.

The module is designed to withstand pressure variations due to altitude changes. The cases are flexible and contain a pressure relief valve. During emergency depressurization, the case will flex inward and at the same time, the pressure valve will allow airflow into the enclosure. No hazard is created, and the enclosure will return to original shape when pressures become equalized.

The modules are configured to provide instrument environmental protection and to facilitate transport. The internal connection system eliminates the need for system level cabling and provides an easy method for instrument reconfiguration. The modules provide an optimized merging of commercial available instrumentation into a compact, portable and ruggedized system.

On the front of each enclosure is an access panel that is easily removable with ¼ turn fasteners. These fasteners are designed with an over-the-center feature that prevents them from becoming loose during vibration.

Plug-in-instruments are located behind this panel to facilitate replacement and repair. The fully loaded enclosure "center of gravity" is very close to the enclosure geometric center. The enclosure is therefore well balanced and easy for operating personnel to handle.

The multi-layer design facilitates use of commercial instruments plugged into VXI card cage. This card cage is mounted to an internal aluminum frame that provides structural support. The aluminum frame is isolated from the enclosure walls with foam cushions. This design configuration is durable and is lightweight.

The standard width for "19 inch" rack mounted equipment is 17 inches. The width for the transient case (enclosure) was in a preferred embodiment selected at 22 inches because this is the optimum packaging size for "19 inch" rack mounted equipment. The 17 inch wide equipment is placed into the 22 inch wide, water tight, EMI protected transient case. The extra space is filled with foam to provide shock and vibration protection.

Lifting handles are recessed into the case sidewall to facilitate transport. Stacking ribs are also molded into the top and bottom surfaces to facilitate set-up. The housing is a water-resistant transient case which provides excellent transport and storage protection.

For transport, the front and rear covers are attached with spin-on knobs, and shipping covers are placed over the external connectors. A containment pouch is located inside the front cover to provide storage for a logbook and operating instructions.

The module, with its stacking ribs, is designed so that there are no external entrapments. As a result, moisture will not collect on the case.

All external covers and external connectors contain elastomer seals to prevent water and dust ingress. The front and rear cover attachment knobs have O-ring type seals to prevent fluid ingress. The lower center section of the case is vented to prevent the internal accumulation of fluid.

For cable protection, a channel section is designed along the case interior sidewall for routing cables from the front to the rear of the enclosure. In order to provide the lightest possible enclosure, laminated construction technology has been incorporated into the enclosure deign.

The structural integrity of the enclosure is obtained from an internal aluminum frame. The internal from provides the shape for the enclosure and creates a structural "safety cage" surrounding the electronic equipment. The frame is wrapped in closed cell flexible foam, and squeezed into a thin wall transient case; much like a plastic sheet stretched over a foam cushion.

The foam is preloaded against the inside of the transient case. The case sidewall, will deflect under load and spring back when the load is removed. The outside shell is sunlight resistant, puncture resistant, flexible, durable, and able to take repeated impacts; and still spring back to its original shape.

The "enclosure to enclosure" structural joints are designed to prevent the system from "coming apart" when subjected to 40 g shock loads. Since connections between cases are done with a side mounted interface connector, the operator does not have to "walk-around" and system to plug in cables; the enclosure can be set-up against a rear bulkhead.

The system is operated and shipped within the same case. The system is composed of several enclosures (dependent on the equipment needed) which are stacked together.

Locating ribs molded into the module help position each case during stacking. Cables are not used for assembly nor as a connection between modules.

Mechanical and electrical attachment is accomplished using a specially designed interface connector between each enclosure. For transport, the system may be left assembled and moved with a forklift, or be separated and handled as individual modules. Each has front and rear covers that are removed for operation, but must be closed to provide moisture protection. For ease of access, controls and indicators are located on the front panels.

There are no louvers on the respective modules. Instead the rear cover partially opens to provide an air inlet. The rear cover is downward facing and design to prevent water ingress.

Under the rear cover is a large dust and dirt filter, which also aids in blocking blowing water from entering the enclosure. Since the dirt filter is large, the air velocities entering the enclosure are very low. The water trapped by the dirt filter wicks down, and drips off the outside of the case rather than being sucked into the electronics. Each module contains four handles positioned above and about the center of gravity for ease of transport and carrying stability.

From the foregoing, it will be observed that numerous variations and modifications may be effected without departing from the spirit and cope of the invention. It is to be understood that no limitation with respect to the specific apparatus illustrated herein is intended or should be inferred. It is, of course, intended to cover by the appended claims all such modifications as fall within the scope of the claims.

What is claimed is:

1. Electronic packaging comprising:
    a foam support body wherein at least one internal, electrical unit receiving volume is defined;
    a separate electromagnetic shield which defines an internal volume for receipt of the body; and
    a separate, non-conductive, exterior, deformable in part, moisture resistant case which defines an internal region for receipt of the shield and the body wherein each of the body, the shield and the case define connector openings;
    wherein the connector openings are aligned with one other on opposing sides of the electronic packaging when the body, shield and case are combined;
    wherein a first electrical connector is positioned in one of the aligned connector openings and a second electrical connector is located in the other of the aligned connector openings; and
    wherein the first and second electrical connectors are coupled to one another by a spring loaded shaft so that one of the first and second electrical connectors forms a floating interface connector movable from an extended operable position to a retracted position inside the case where the floating interface connector is protected from damage.

2. Electronic packaging as in claim 1 wherein the floating interface connector, is extendable, at least in part, through the connector opening from the retracted position to the operable position.

3. Electronic packaging as in claim 1 wherein the shield comprises an EMI conductive bag.

4. Electronic packaging as in claim 3 wherein the bag is supported, at least in part, by access opening defining rigid conductive elements.

5. Electronic packaging as in claim 1 wherein the body defines at least one air flow path.

6. Electronic packaging as in claim 1 wherein the body defines at least one cable receiving path.

7. Electronic packaging as in claim 6 wherein electrical wiring extends along the path.

8. Electronic packaging as in claim 7 wherein electrical connectors positioned in the aligned openings are couplable to electrical wiring.

9. Electronic packaging as in claim 8 wherein the first and second electrical connectors includes a connector block with a plurality of conductor receiving openings.

10. Electronic packaging as in claim 9 wherein the connector receiving openings are enclosed by the shield.

11. Electronic packaging as in claim 8 wherein at least one of the first and second connectors permits a second substantially identical case can be coupled thereto so that a single shield is formed therearound.

12. Electronic packaging as in claim 1 which includes an electro-magnetic radiation excluding end screen carried by the case adjacent to an air intake thereof.

13. Electronic packaging as in claim 12 which includes an air filter located adjacent to the end screen.

14. Electronic packaging as in claim 13 which includes an air intake device located adjacent to the air filter.

15. Electronic packaging as in claim 14 wherein the filter is sized to, in combination with the air intake device, provide low velocity air flow through the filter in inhibit an inflow of airborne moisture through the filter.

16. Electronic packaging as in claim 1 wherein the case comprises molded plastic which is deformable a predetermined amount to absorb mechanical shocks.

17. Electronic packaging as in claim 1 wherein the receiving volume has a shape for receipt and support of a unit in the absence of brackets and shock absorbers.

18. Electronic packaging as in claim 1 wherein the shield and the case define second connector openings aligned with one other on opposing sides of the electronic packaging when the body, shield and case are combined;

wherein an electrical connector is positioned in one of the second, aligned connector openings and another electrical connector is located in the other of the second, aligned connector openings; and wherein the electrical connectors are coupled by a spring loaded shaft so that one of the electrical connector elements is a floating interface connector movable from an operable position to a position inside the case where the floating interface connector is protected from damage.

19. Electronic packaging as in claim 1 wherein a first type of connector is positioned in one aligned connector opening and a second, different, connector is located in the other aligned connector opening.

20. Electronic packaging as in claim 19 wherein the electrical connectors are each surrounded by the shield, whereupon if a first type of connector, carried by one case, engages a second type of connector carried by another case, the respective shields contact one another enclosing the connectors and forming a shield engagement region.

21. Electronic packaging as in claim 1 wherein the spring loaded shaft has an end retained in a hollow sleeve adjacent a cylindrical spring.

22. Electronic packaging as in claim 21 wherein the spring retracts the the floating interface connector.

23. Electronic packaging as in claim 21 wherein the sleeve attaches the end to one of the connectors.

24. Electronic packaging as in claim 21 wherein the shaft is displaceble axially to space the connectors apart from one another and movable angularly to lock a first type of connector to a second type.

25. Electronic packaging as in claim 19 wherein the first type of connector carries a first type of contact and wherein the second type of connector carries a second type of contact.

* * * * *

UNITED STATES PATENT AND TRADEMARK OFFICE
CERTIFICATE OF CORRECTION

PATENT NO.     : 6,242,691 B1                                      Page 1 of 1
DATED          : June 5, 2001
INVENTOR(S)    : Kenneth C. Reese et al.

It is certified that error appears in the above-identified patent and that said Letters Patent is hereby corrected as shown below:

<u>Title page,</u>
Inventors, line 5, change Mark "A." Wilson to Mark "P." Wilson.

Signed and Sealed this

Twenty-second Day of January, 2002

Attest:

Attesting Officer

JAMES E. ROGAN
*Director of the United States Patent and Trademark Office*